United States Patent [19]

Okabayashi et al.

[11] 4,348,746

[45] Sep. 7, 1982

[54] SEMICONDUCTOR INTEGRATED CIRCUIT DEVICE HAVING A PLURALITY OF INSULATED GATE FIELD EFFECT TRANSISTORS

[75] Inventors: Hidekazu Okabayashi; Kohei Higuchi; Tadatoshi Nozaki, all of Tokyo, Japan

[73] Assignee: Nippon Electric Co., Ltd., Tokyo, Japan

[21] Appl. No.: 135,032

[22] Filed: Mar. 28, 1980

[30] Foreign Application Priority Data

Mar. 30, 1979 [JP] Japan .................. 54-39171

[51] Int. Cl.$^3$ .................. G11C 11/40; H01L 27/04
[52] U.S. Cl. .................. 365/182; 29/571; 148/188; 357/23; 357/41; 357/59; 357/71
[58] Field of Search .......... 357/41, 42, 23, 59, 357/67, 71, 23 S, 23 D; 365/149, 150, 154, 182, 186, 188

[56] References Cited

U.S. PATENT DOCUMENTS

| | | | |
|---|---|---|---|
| 3,771,147 | 11/1973 | Bollet et al. .................. | 365/149 |
| 3,953,839 | 4/1976 | Dennison et al. .................. | 365/188 |
| 4,012,757 | 3/1977 | Koo .................. | 357/24 |
| 4,227,944 | 10/1980 | Brown et al. .................. | 357/67 |

FOREIGN PATENT DOCUMENTS 2142050  3/1972  Fed. Rep. of Germany ........ 357/41

OTHER PUBLICATIONS

Brown et al., IEEE Trans. on Electron Devices, vol. ED 13, No. 10, Oct. 1971, pp. 931–939.

*Primary Examiner*—William D. Larkins
*Attorney, Agent, or Firm*—Sughrue, Mion, Zinn, MacPeak & Seas

[57] ABSTRACT

An integrated circuit device includes a first enhancement-type IGFET and a second depletion-type IGFET, each of which includes source and drain regions formed in the upper surface of a semiconductor substrate. Both IGFETs include a gate insulator film formed over their channel regions, the first IGFET having a high melting point metal gate electrode formed over its gate insulator without contacting the substrate surface and the second IGFET having a polycrystalline semiconductor gate electrode which directly contacts the substrate at a source/drain region common to the two IGFETs. Such a structure is used to form part of a semiconductor memory device having word lines of high melting point metal.

16 Claims, 33 Drawing Figures

SEMICONDUCTOR INTEGRATED CIRCUIT DEVICE HAVING A PLURALITY OF INSULATED GATE FIELD EFFECT TRANSISTORS

BACKGROUND OF THE INVENTION

The invention relates to a semiconductor integrated circuit device having a plurality of insulated gate field effect transistors (hereinafter abbreviated as "IGFET's"), more particularly to such a device operable at a high speed and having a high reliability.

The degree of integration of integrated circuit devices having IGFET's has been increasing at a growing rate due to the use of the polycrystalline silicon gate technique and owing to the progress of the technique of micro-fine patterning. The realization of the high degree of integration made possible by the micro-fine patterning of the silicon wiring has brought about a great enhancement of the operating speed of integrated circuits, but has also resulted in a significant delay in signal transmission time due to the resistance of the polycrystalline silicon wiring.

As one solution for this problem, attempts have been made by many investigators to replace all the thin film pattern of polycrystalline silicon used for gate electrodes and wirings by thin film patterns of low-resistance high-melting-point metal, or refractory metal, such as molybdenum, tungsten, etc. However, the replacement of the gate electrode along with the same level wiring which is continuous to the gate electrode (for the sake of simplicity, hereinafter generally called "gate wiring", which is used in the form of "polycrystalline silicon gate wiring", "high-melting-point metal gate wiring", etc.) and is made of polycrystalline silicon, by a high-melting-point metal gate wiring made of molybdenum or the like still involves a number of problems, and therefore no single method for replacement has yet been established. The problem relating to "direct contact" which will be defined later is one of the important problems among these methods.

Figure 1:
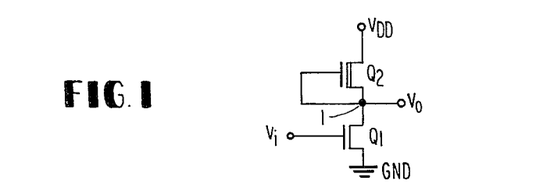
FIG. 1 is a circuit diagram of an inverter circuit having an E/D construction.
Figure 2A:
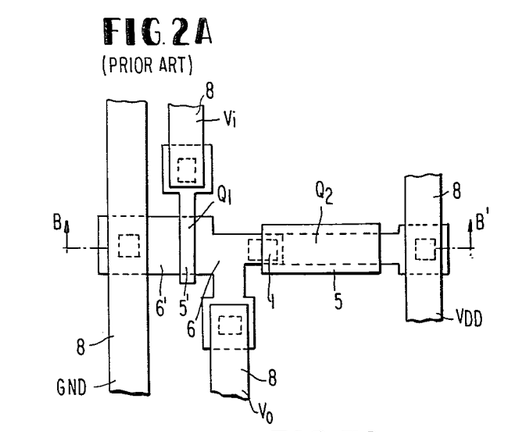
FIG. 2A is a plan view of the inverter shown in FIG. 1, which is constructed according to a known technique.
Figure 2B:
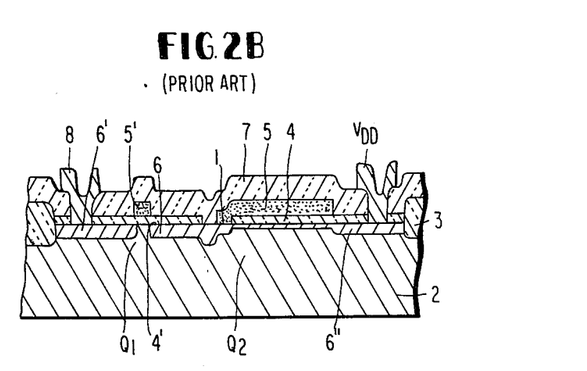
FIG. 2B is a cross-sectional view taken along line B-B' in FIG. 2A as viewed in the direction of the arrows.

A circuit construction shown in FIG. 1, that is, an inverter circuit of the so-called E/D construction is one of the most important basic constructions among the IGFET type integrated circuits. In this circuit, a transistor $Q_1$ is an enhancement type (E-type) driving IGFET, and the other transistor $Q_2$ is a depletion typw (D-type) load IFGET. If this inverter is conventionally formed by a silicon gate IGFET, for instance, it can be formed in the pattern arrangement as shown in FIGS. 2A and 2B. In FIG. 2B, dotted regions represent polycrystalline silicon gate wirings. In these figures, reference numeral 1 designates a junction point 1 in FIG. 1, numeral 2 a p-type silicon substrate, numeral 3 a field oxide film, numerals 4 and 4' gate oxide films, numerals 5 and 5' doped polycrystalline silicon gate wirings, numerals 6, 6' and 6" n+ source, drain regions, numeral 7 a phosphorus glass film, and numerals 8 aluminum wiring layers. In this silicon gate structure, as will be seen from FIGS. 2A and 2B, the polycrystalline silicon gate electrode 5 of the load transistor $Q_2$ is in itself used as a wiring for connecting to the n+ region 6 of the substrate, and thus the junction point or the contact section 1 in FIG. 1 is realized by directly connecting the extension of the gate electrode 5 onto the surface of the semiconductor substrate without the intermediary of a metallic wiring. Throughout this specification, the term "direct contact" shall mean such direct connections between the extension of the polycrystalline silicon layer and the surface of the semiconductor substrate. Where the "direct contact" is employed, freedom in pattern arrangement becomes large and the area necessitated for the pattern arrangement can be made small. Therefore, it is a common technique used in silicon gate structures.

Now, if the polycrystalline silicon gate wiring in the silicon gate structure should be in itself replaced by a high-melting-point metal gate wiring as of molybdenum or the like, then the direct contact 1 in FIGS. 2A and 2B would be a contact between monocrystalline silicon (substrate) and a high-melting-point metal. However, the presently known direct contact technique between monocrystalline silicon and a high-melting-point metal cannot be used in such a case for the following reasons. That is, in the manufacturing process of an IGFET type integrated circuit, the highly-doped source and drain regions 6' 6" and 6 of the IGFETs are formed by ion implantation and thermal diffusion after formation of the gate electrode pattern and thus after formation of the direct contact. Therefore, it is necessary that a heat treatment process at about 1000° C. be applied after formation of the contact. With a high-melting-point metal gate structure of molybdenum, if a high-temperature heat treatment process at about 1000° C. is applied to the contact between the high-melting-point metal and the substrate monocrystalline silicon, then silicide of the high-melting-point metal is formed by the reaction between the high-melting-point metal and the substrate monocrystalline silicon, resulting in volume reduction and the generation of a significant stress in the contact section. Also, in some cases, the reaction for formation of silicide does not proceed uniformly, and an undesirable unevenness arises on the surface of the reaction layer. Such stress and surface unevenness would sometimes induce crystal defects in the substrate silicon at the contact section, would cause deterioration of electric properties at the contact section and at the p-n junction existing near the contact, and may even result in peeling-off of the silicide layer from the substrate silicon. For these reasons, the mere replacement of the polycrystalline silicon pattern in the heretofore known silicon gate structure a high-melting-point metal pattern is not acceptable in the manufacturing of IGFET type integrated circuits.

Figure 3A:
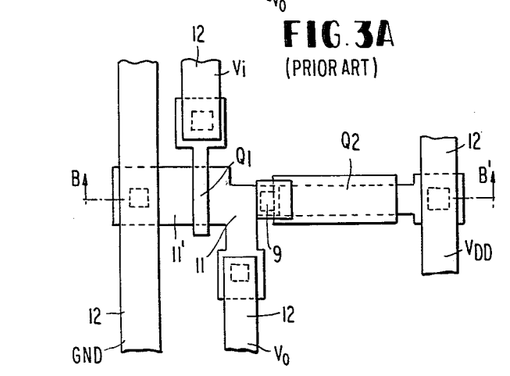
FIG. 3A is a plan view of the inverter shown in FIG. 1 which is constructed in a different structure from that shown in FIGS. 2A and 2B according to the heretofore known technique.
Figure 3B:
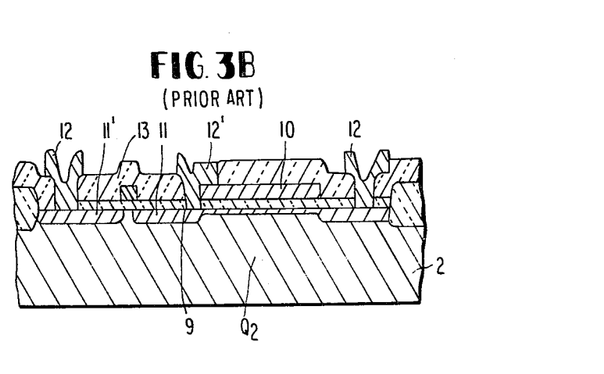
FIG. 3B is a cross-sectional view taken along line B-B' in FIG. 3A as viewed in the direction of the arrows.
Figure 4:
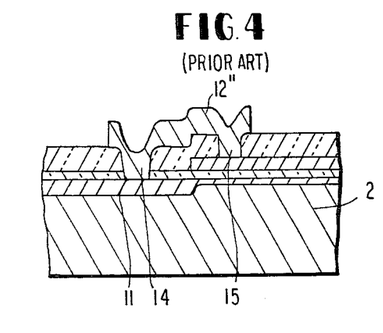
FIG. 4 is a cross-sectional view showing a connection between a gate electrode and a silicon substrate according to the heretofore known technique.
Figures 5A, 5B:
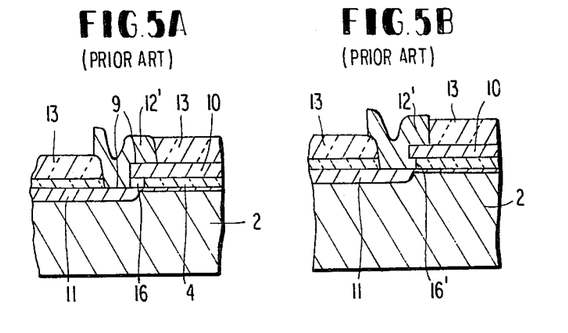
FIGS. 5A and 5B are cross-sectional views showing connections between a gate electrode and a silicon substrate which are constructed respectively in different structures from that shown in FIG. 4 according to the heretofore known technique.

Accordingly, when a high-melting-point gate structure is employed, the connection between the gate electrode of the load transistor $Q_2$ and the contact section 1 is formed at the same time as the metal wiring in the top layer (normally, aluminum aluminum alloy wiring), without employing the direct contact. One example of such a structure is shown in FIGS. 3A and 3B. FIG. 3B is a cross-sectional view taken along line B—B' in FIG. 3A as viewed in the direction of the arrows. In these figures, a connecting wiring layer 12' between the high-melting-point metal gate 10 of load transistor $Q_2$ and a high concentration doping region 11 is formed at the same time as aluminum wirings 12 such as a ground line GND, a power supply $V_{DD}$, etc. are formed, and on the same level as these internal wirings 12. The connecting wiring layer 12' such as an aluminum layer is connected to the region 11 at the contact section 9. In the illustrated example, this connecting wiring layer 12' is formed with a structure similar to that of a direct contact so that no increase of contact area may arise as compared to the case of a direct contact. In other words, the layer 12' is formed in a single contact hole. If desired, contact holes 14 and 15 can be provided respectively on the gate electrode and on the high concentration region 11, and the connecting wiring layer 12'' can bridge between these holes as shown in FIG. 4, but in such a case there is a disadvantage in that increase in the area for pattern arrangement is generally inevitable. Moreover, the prior art structure shown in FIGS. 3A and 3B having a single contact hole cannot be used practically for the following reasons. In the case of forming a single contact hole as shown in FIG. 3, after an insulating film 13 has been formed it is necessary to open the contact hole by etching as seen in FIG. 3B, and the etching time is determined to be rather long so that, due to fluctuations of the etching speed within a wafer due to unevenness of the surface condition and thickness of the insulating film 13 and the gate oxide film as well as the concentration of an effective etching component in the etching liquid, etching at a fixed rate will normally result in over-etching. Then, in the case of the united contact section 9, the gate electrode 10 is made of a material that cannot be etched normally in the etching process for opening the contact hole, and hence the over-etching will result in etching of the gate oxide film 4 under the gate electrode 10, resulting in an undercut. In the case where the undercut has been formed, if the reentrance of the aluminum connecting layer 12' into the undercut is poor, a hollow space 16 will remain as shown in FIG. 5A, or even if the reentrance is well effected, there will occur the situation where the aluminum connecting layer 12' makes direct contact or short contact with the channel region at the part 16' as shown in FIG. 5B, since, due to the increasing density of integrated circuits, manufacturing processes are employed which result in little lateral diffusion of dopant. Accordingly, in the case of employing the united contact having the structure as shown in FIG. 3, more accurate control for the manufacturing process is required than in the case of the prior art silicon gate structure.

Furthermore, in the case of employing the united contact having the structure as shown in FIG. 3, since the aluminum connecting layer 12' at the single contact hole and the other aluminum wiring 12 for internal connection are formed at the same level, a restriction is imposed upon the pattern arrangement that the aluminum internal wirings 12 must be arranged so as to avoid the single contact hole or to avoid the aluminum connecting layer 12'. In a large scale integrated circuit, inverters having the circuit construction as shown in FIG. 1 are disposed in a very great number at a high density and the density of the aluminum wirings 12 for connecting them is also necessarily high. Therefore, the requirement that the aluminum internal wirings 12 must be arranged so as to avoid the single contact holes, is a great.

SUMMARY OF THE INVENTION

It is one object of the present invention to provide a novel IGFET type integrated circuit structure in which the problem of the wiring resistance in the polycrystalline silicon gate structure as well as the problem of the direct contact in the high-melting-point metal gate structure have been greatly mitigated.

According to one feature of the present invention, there is provided a semiconductor integrated circuit device comprising; a first IGFET including source and drain regions formed along a major surface of a semiconductor substrate, a channel region positioned between these source and drain regions, a gate insulator film formed on said channel region, and a gate electrode made of a high-melting-point metal or a refractory metal and formed on the gate insulator film; and a second IGFET including a gate insulator film formed on the major surface of the substrate and a gate electrode, made of a semiconductor material such as polycrystalline silicon, formed on said gate insulator film of the second IGFET and contacting directly at its extension part with a surface of one of the source and drain regions of the first IGFET. The high-melting-point metal, or the refractory metal, may be selected from molybdenum, tungsten, titanium, tantalum, or an alloy of two or more of these metals or of any one or more and silicon.

According to another feature of the present invention, there is provided a semiconductor integrated circuit device comprising a semiconductor substrate of one conductivity type, a first IGFET (for example enhancement type) and a second IGFET (for example depletion type), the first IGFET including source and drain regions of the opposite conductivity type provided in a major surface of the substrate, a channel region positioned between these source and drain regions, a gate insulator film formed on the channel region and a gate electrode made of a high-melting-point metal and formed on the gate insulator film, the gate electrode of the first IGFET not contacting directly with any part of the major surface of the substrate, the second IGFET including source and drain regions of the opposite conductivity type provided in the major surface of the substrate, a channel region positioned between these source and drain regions, a gate insulator film formed on the channel region and a gate electrode made of a semiconductor material and formed on the gate insulator film of the second IGFET, the gate electrode of the second IGFET being contacted with one of these source and drain regions of the second IGFET. The source or drain region of the first IGFET may be continuously formed from the source or drain region of the second IGFET to which the silicon gate electrode of the second IGFET is directly contacted.

According to another aspect of the present invention, there is provided a semiconductor memory device comprising a plurality of pairs of bit lines extending in the column direction, a plurality of word lines made of a high-melting-point metal and extending in the row direction and a plurality of static memory cells arranged in a matrix form and connecting respectively to each pair of bit lines and each word line, the static memory cell including first and second transfer gate transistors each having its source or drain connected to one of a pair of bit lines two load transistors and two driving transistors, the gate electrode of the first transfer gate transistor being shaped from one part of a word line made of said high-melting-point metal, the gate electrode of the second transfer gate transistor being shaped from another part of said word line, and the two load transistors and said two driving transistors being silicon gate type transistors.

In the above mentioned static memory device, the peripheral circuits such as X-decoder, Y-decoder, or Y-selector transistors are favorably composed of silicon gate type IGFET's. Moreover, each word line of high-melting-point metal may be connected to each silicon gate electrode of the load transistor in each X-decoder via an aluminum connecting layer.

According to a still further aspect of the present invention, there is provided a semiconductor memory device comprising a plurality of bit lines extending in the column direction, a plurality of word lines made of a high-melting-point metal and extending in the row direction and a plurality of dynamic memory cells arranged in a matrix form and connecting respectively to each bit line and each word line, the memory cell including a transfer gate transistor and a capacitor, the transfer gate transistor having a source or drain impurity region being in the form of an island and connecting to said bit line, a channel region abutting against the impurity region, a gate insulator film formed on the channel region and a gate electrode being shaped from one part of the word line made of said high-melting-point metal and being self-aligned with the impurity region, the capacitor having an inversion layer abutting directly against the channel region, an insulator layer positioned on the inversion layer and an upper electrode made of polycrystalline silicon.

In the above mentioned dynamic memory device, the peripheral circuits such as X-decoder and Y-decoder are favorably composed of silicon gate type IGFET's. Moreover, each word line of high-melting-point metal may be connected to either the source or drain region of one transistor in the X-decoder by intermediary of an aluminum connecting layer.

In the structure according to the present invention, since the direct contact section is formed of the heretofore known silicon gate structure, the other internal wirings of aluminum or aluminum alloy can be formed in the shape of multi-layer wirings, so that freedom in the pattern arrangement is not restricted and the area necessitated for the pattern arrangement can be made small. Moreover, while wirings not having a direct contact are in most cases long wirings, since these wirings are formed of high-melting-point metal that has an extremely low resistance the wiring resistances at these portions can be remarkably reduced as compared to the polycrystalline silicon structure in the prior art.

DESCRIPTION OF PREFERRED EMBODIMENTS

First Preferred Embodiment

Figure 6:
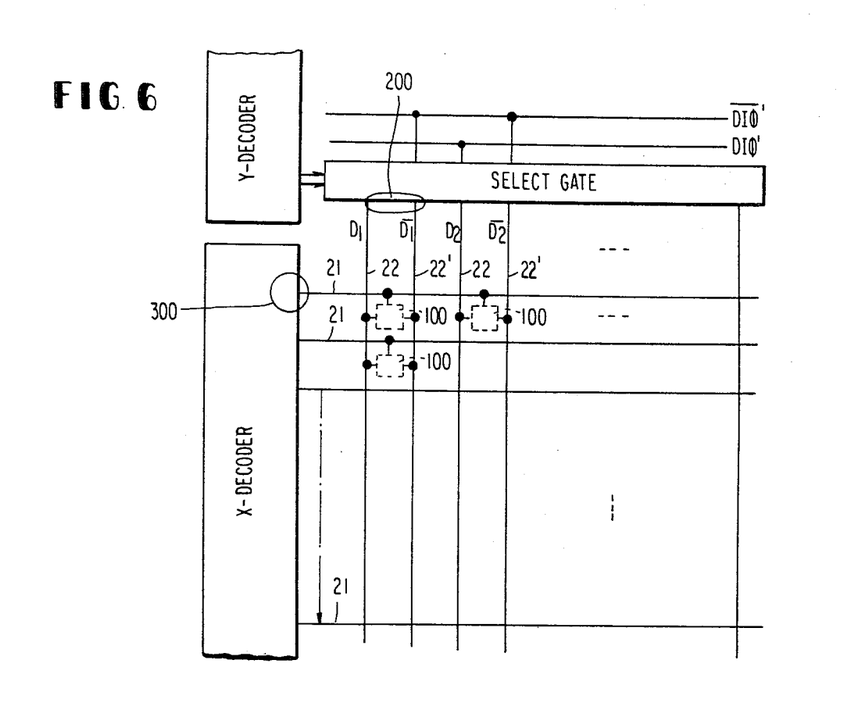
FIG. 6 is a block diagram showing a semiconductor memory device according to a first preferred embodiment of the present invention.
Figure 7:
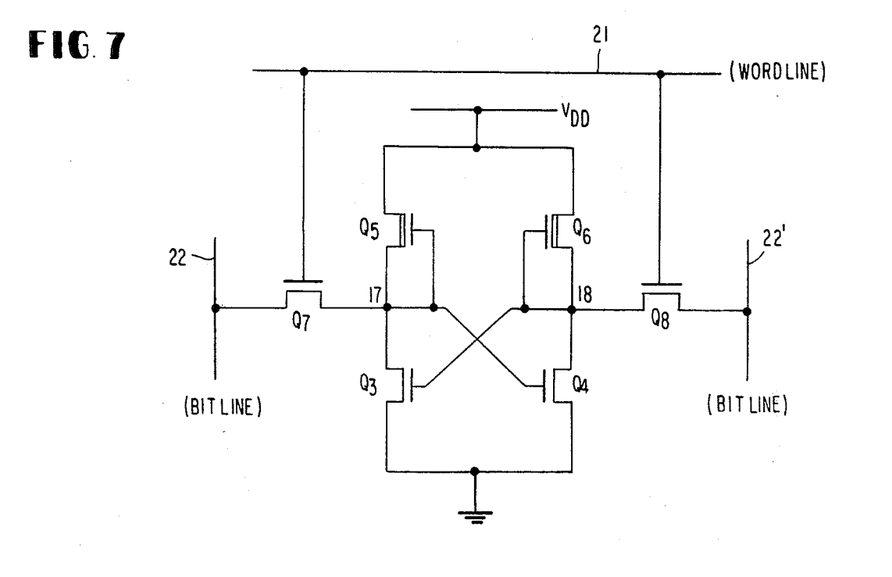
FIG. 7 is a circuit diagram showing one memory cell 100 in the memory device shown in FIG. 6.

FIG. 6 is a block diagram of a static RAM to which the present invention is applied. In this figure, a plurality of word lines 21 to be connected respectively to an X-decoder extend in the transverse direction or row direction, and at right angles thereto a plurality of pairs of bit lines 22 and 22' extend in the longitudinal or column direction to be connected respectively to select gate transistors. To these select gate transistors are connected a Y-decoder and a pair of data bus lines $DI\phi'$ and $\overline{DI\phi'}$. As will be explained in more detail later, the word lines are made of molybdenum and are connected either directly or via aluminum layers to silicon gates of silicon gate type transistors in the X-decoder, while the bit lines are made of aluminum and are connected directly to drain regions of selector transistors. To these word lines and bit lines are connected a plurality of memory cells 100, which are disposed in a matrix form. Each memory cell in this static RAM is constructed as shown in FIG. 7. Basically, this circuit is constructed by connecting two inverters in FIG. 1 in a crossed relation and adding two transfer gate transistors thereto. Transistors $Q_3$ and $Q_4$ are E-type driving transistors, transistors $Q_5$ and $Q_6$ are D-type load transistors, and transistors $Q_7$ and $Q_8$ are transistors for use as transfer gates. Junction points 17 and 18 are direct contact sections.

Figures 8A, 8B:
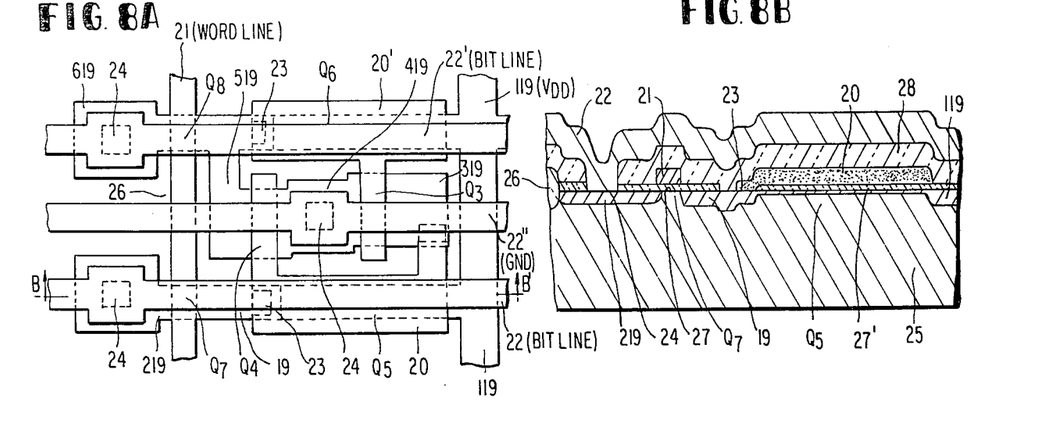
FIG. 8A is a plan view of the memory cell shown in FIG. 7.
FIG. 8B is a cross-sectional view taken along line B-B' in FIG. 8A as viewed in the direction of the arrows.

FIG. 8A shows a pattern arrangement of the circuit construction shown in FIG. 7, and FIG. 8B is a cross-sectional view-taken along line B—B' in FIG. 8A. In the active areas surrounded by the buried field oxide layer 26, n+ regions 19, 119, 219, 319, 419, 519 and 619 are formed along the major surface of the p type silicon substrate 25. Regions 319 and 419, 419 and 519, 19 and 119, 519 and 119, 219 and 19, and 619 and 519 are source and drain regions of transistors $Q_3$, $Q_4$, $Q_5$, $Q_6$, $Q_7$ and $Q_8$, respectively. A pair of bit lines 22 and 22' made of aluminum are respectively connected to regions 219 and 619 at the contact sections 24 through holes in the inter-layer insulating film 28 made of phosphorus glass. Also, a ground line 22" made of aluminum is connected to region 419 at the contact section 24. Regions 119 are integrated to form a $V_{DD}$ line which extends to one direction. The n type polycrystalline silicon layers 20 and 20' of 0.4 $\mu$m thickness and $10^{20}$ atoms/cm$^3$ impurity density are formed on gate insulator film 27', and serve as silicon gate electrodes of transistors $Q_4$, $Q_5$, $Q_3$ and $Q_6$, respectively. These silicon gate electrodes 20 and 20' are directly connected to the impurity regions 19 and 519, respectively, at direct contact sections 23 of 2 $\mu$m $\times$ 3 $\mu$m area. On the other hand, the word line 21 made of high-melting-point metal such as, for example, molybdenum is formed on the gate insulator film 27 and the thick field oxide layer 26, and extends in one direction. A first part and a second part of the word line 21 just over the gate insulator films 27 serve as gate electrodes of transfer gate transistors $Q_7$ and $Q_8$, respectively. Naturally, in the present invention, source and drain regions except the direct contact sections 23 are formed in a self-aligned fashion with respect to the silicon gates, and the high-melting-point metal gates respectively.

As will be seen from these figures, in the illustrated embodiment, since the direct contact electrodes of the load transistors and driving transistors are formed of the heretofore known polycrystalline silicon gate structures, aluminum wirings of the bit lines 22, 22', etc. can be formed in a multi-layer structure above the direct contacts via an inter-layer insulating film, and thereby the memory cell can be designed with the same size as the silicon gate structure in the prior art. In addition, since the long word wirings 21 which were a problem in the large capacity static RAM in the prior art are replaced by high-melting-point metal wirings such as, for example, molybdenum wirings which have low resistances, the signal delay caused by wiring resistances of the word wirings is very small, and thus the access time for the entire memory can be shortened by about 7 nanoseconds as compared to the case where the polycrystalline silicon gate structure in the prior art was employed.

Figure 9A:
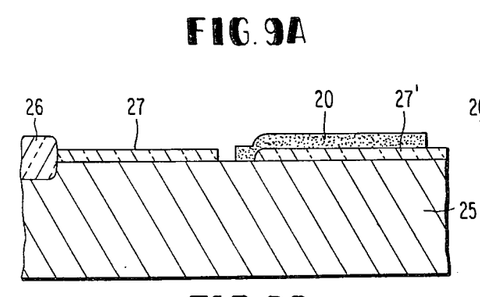
FIGS. 9A to 9C are cross-sectional views showing successive steps in the manufacturing process of the memory cell shown in FIGS. 8A and 8B according to the first preferred embodiment of the present invention.
Figure 9B:
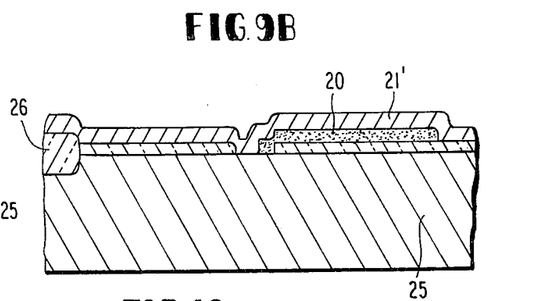
Figures 9C, 10, 11A, 11B:
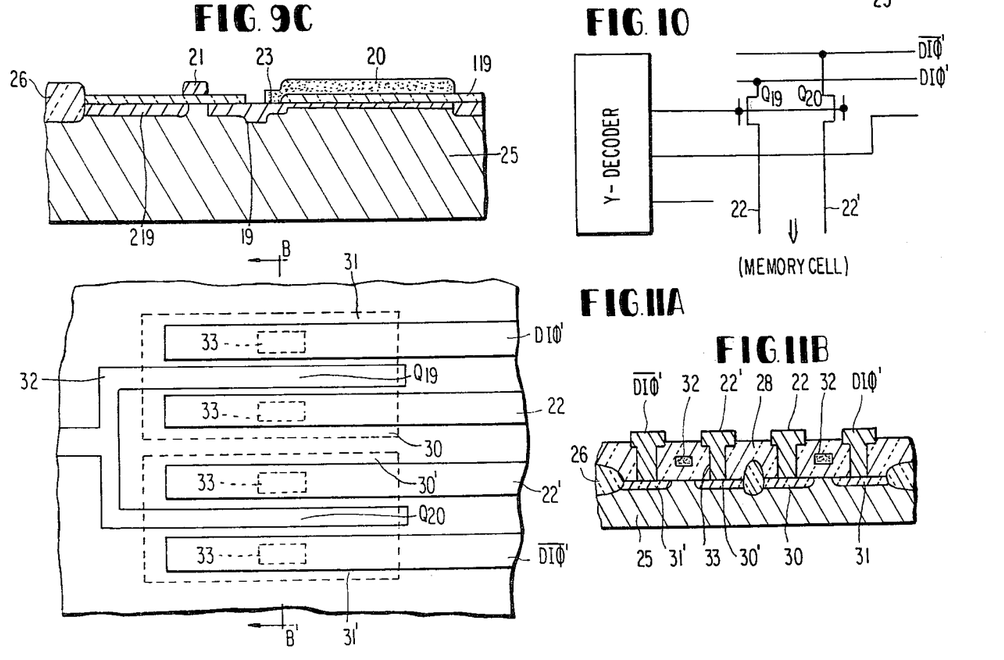
FIG. 10 is a circuit diagram showing an encircled portion 200 in the memory device shown in FIG. 6.
FIG. 11A is a plan view of selector transistors shown in FIG. 10.
FIG. 11B is a cross-sectional view taken along line B-B' in FIG. 11A as viewed in the direction of the arrows.

Now description will be made on the essential points of a practical manufacturing process for the structure according to this preferred embodiment illustrated in FIGS. 8A and 8B. As shown in FIG. 9A, after a field oxide film 26 and a gate oxide film 27, 27' have been formed on a surface of a p-type silicon substrate 25 through a conventional process, a polycrystalline silicon film doped with phosphorus is deposited, for instance, through a chemical vapor deposition process, and then gate electrodes 20, 20' and direct contacts 23 of transistors having direct contacts are formed, for instance, through a photo-etching process. Subsequently, as shown in FIG. 9B, a molybdenum thin film 21' is deposited, for instance, through a sputtering process. After a gate wiring 21, which has no direct contact and is made of high-melting-point metal such as molybdenum, has been formed as shown in FIG. 9C, for instance, through a photo-etching process, n+ regions 19, 119, 219, etc. are formed, for instance, through an ion implantation process using the molybdenum gate 21, the silicon gate 20 and the field oxide film 26 as masks. At this moment, although the dopant ions introduced by ion implantation do not reach the region right under the direct contacts 23, since the polycrystalline silicon film forming the direct contacts 23 is highly doped with phosphorous, diffusion of phosphurus into the substrate silicon right under the direct contacts 23 occurs during high-temperature annealing of the ion-implanted layer, and thereby direct contacts having good ohmic characteristics can be formed. Thereafter, through the same process as in the case of the conventional silicon gate structure or high-melting-point metal gate structure, an inter-layer insulating film 28 is formed and contact holes are opened as shown in FIG. 8B, and then after phosphorus gas fluidization has been effected at 950° C., aluminum internal wirings 22, 22' and 22" are formed.

From a structural standpoint according to the present invention, it is essentially of no concern which of the silicon gate wirings having direct contacts and the high-melting-point metal wirings not having a direct contact are formed first. However, in view of the manufacturing technique it is desirable to form the silicon gate wirings first as described above. The reason for this is that where the high-melting-point metal gate wirings as of molybdenum are formed at first, upon etching the silicon thin film formed on said high-melting-point metal gate wirings it is generally very difficult to etch off only the silicon thin film without some etching at the base of the high-melting-point metal film, whether a dry type etching process or a wet type etching process is employed. On the contrary, in the case where the silicon gate wirings are formed at first, it is generally easy to etch off the high-melting-point metal film formed on the silicon gate wirings. For instance, with respect to a molybdenum film, the above-mentioned object can be achieved by employing a solution of potassium ferricyanide series or hydrogen peroxide and aqueous ammonia.

Each pair of bit lines 22 and 22' shown in FIGS. 7 and 8A are, at their one ends shown by the encircled portion 200 in FIG. 6, connected to Y-selector transistors $Q_{19}$ and $Q_{20}$, respectively, as shown in FIG. 10. The structure of the portion 200 is illustrated in FIGS. 11A and 11B. The bit lines 22 and 22' made of aluminum are directly connected to n+ drain regions 30 and 30' of the transistors $Q_{19}$ and $Q_{20}$, respectively, through apertures 33 provided in an insulating film 28. Source regions 31 and 31' of the transistors $Q_{19}$ and $Q_{20}$ are respectively connected to data bus lines DI$\phi$' and $\overline{DI\phi}$'. Gate electrodes 32 of the transistors $Q_{19}$ and $Q_{20}$ are connected in common and made of polycrystalline silicon, and they are led out to a Y-decoder as best seen in FIG. 11A.

Figure 12:
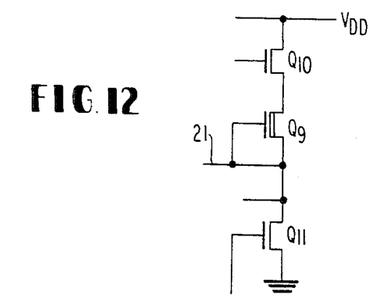
FIG. 12 is a circuit diagram showing an encircled portion 300 in the memory device shown in FIG. 6.
Figure 13A:
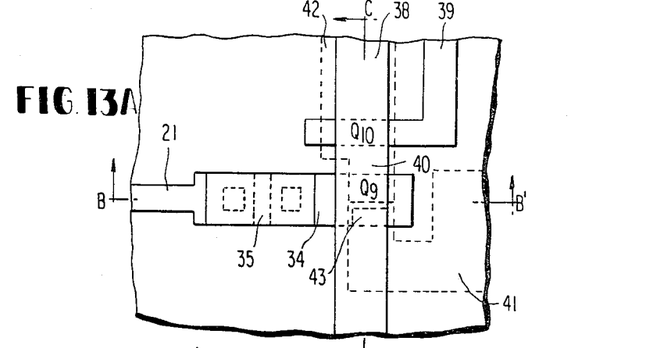
FIG. 13A is a plan view showing a part of the circuiting shown in FIG. 12.
Figure 13B:
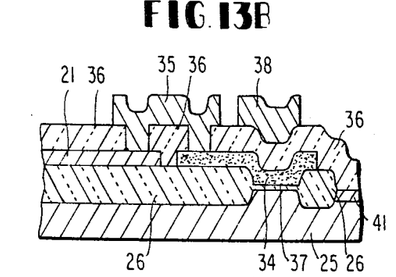
FIG. 13B is a cross-sectional view taken along line B—B' in FIG. 13A as viewed in the direction of the arrows, FIG. 13B' is a cross-sectional view showing a modified structure of the portion shown in FIG. 13B.
Figure 13C:
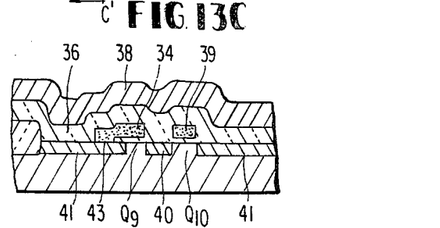
FIG. 13C is a cross-sectional view taken along line C-C' in FIG. 13A as viewed in the direction of the arrows.

On the other hand, each word line 21 shown in FIGS. 7, 8A and 8B and made of molybdenum is, at its one end shown by the encircled portion 300 in FIG. 6, led to each X-decoder, where it is connected to a junction point between a load transistor $Q_9$ and an input transistor $Q_{11}$, as shown in FIG. 12. The structure of the portion 300 is illustrated in FIGS. 13A, 13B and 13C. With reference to these figures, the word line 21 is connected to a gate electrode 34, made of silicon, of the transistor $Q_9$ via an aluminum layer 35 in the shape of a bridge. While this gate electrode 34 is provided on gate insulating film 37 as shown in FIG. 13B, it is directly connected to an n+ drain region 41 at direct contact section 43 of 5 $\mu$m×2.5 $\mu$m area as shown in FIG. 13C.

Above the region between a common source-drain region 40 of the transistors $Q_9$ and $Q_{10}$ and a source region 42 of the transistor $Q_{10}$ extends a silicon gate electrode 39 of the transistor $Q_{10}$, and above these transistors extends a $V_{DD}$ line 38 via an insulating film 36. IN this way, the gate electrodes of the transistors in the peripheral circuits do not extend as long as the word lines in the memory matrix, and hence the resistances of these gate electrodes are less significant. Therefore, these gate electrodes can be advantageously made of silicon even if they do not have a direct contact.

Alternatively, without the intermediary of the aluminum layer 35 in FIG. 13B, the word line 21 made of molybdenum and the silicon gate electrode 34 could be directly connected to each other at a connecting section 44 as shown in FIG. 13B'.

Second Preferred Embodiment

Figure 14:
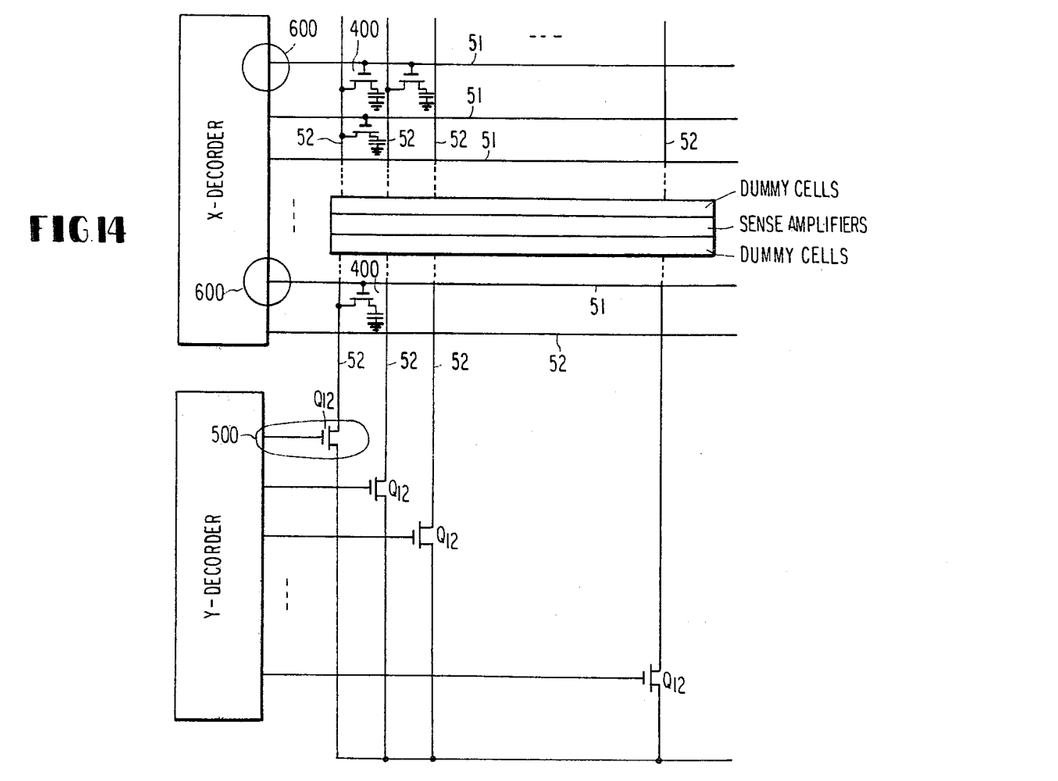
FIG. 14 is a block diagram showing a semiconductor memory device according to a second preferred embodiment of the present invention.

Now another preferred embodiment of the present invention will be described in which the invention is applied to a memory device employing memory cells each consisting of one transistor and one capacitor. As shown in FIG. 14, a plurality of word lines 51 to be connected to an X-decoder extend in the transverse direction or the row direction, and a plurality of bit lines 52 to be connected to a plurality of Y-select switching transistors $Q_{12}$ which are in turn connected to a Y-decoder extend in the longitudinal direction or the column direction. Also, each bit line 52 is connected to dummy cells and sense-amplifiers. To these word lines 51 and bit lines 52 are connected a plurality of memory cells 400 so as to form a matrix-shaped array.

Figure 15A:
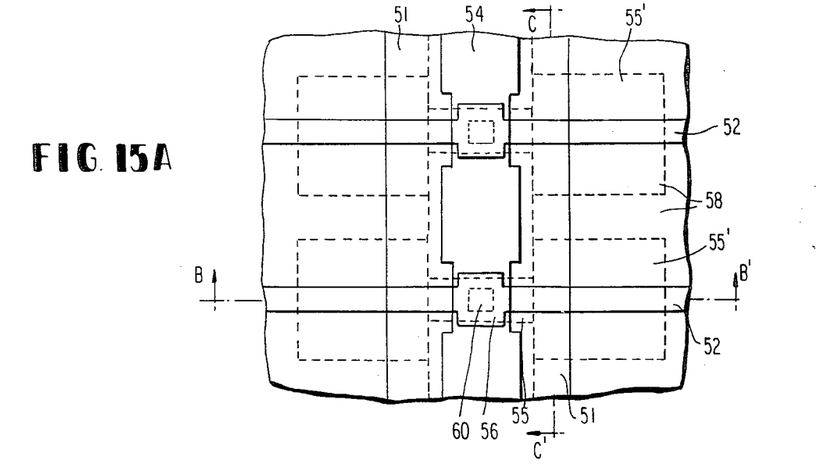
FIG. 15A is a plan view of a memory cell 400 shown in FIG. 14, FIGS. 15B and 15C are cross-sectional views taken along lines B-B' and C-C', respectively, in FIG. 15A as viewed in the direction of arrows.
Figure 15B:
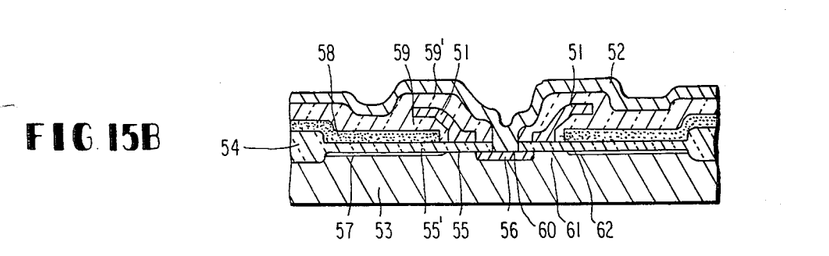
Figure 15C:
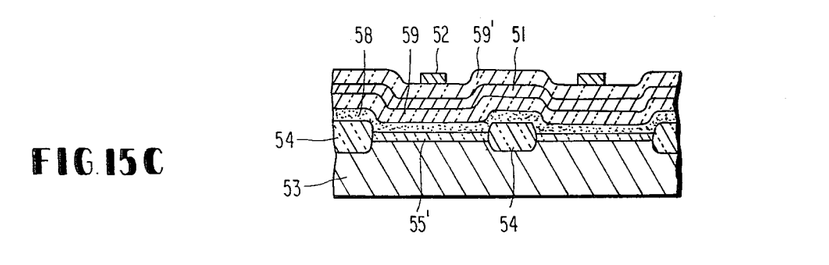

The structure of each memory cell 400 is illustrated in FIGS. 15A, 15B and 15C. In a p-type semiconductor silicon substrate 53 is formed a thick field oxide film 54, and in an active region of the substrate 53 surrounded by the field oxide film 54 are formed a transistor and a capacitor. To an n+drain region 56 of the transistor is connected a bit line 52 made of aluminum at a contact section 60. Above a channel region 61 of the transistor is provided a gate electrode 51 by the intermediary of a gate insulator film 55. This gate electrode is integral with the word line 51 and is made of molybdenum. Also, the end of this gate electrode of the structure is self-aligned with respect to the drain region 56.

Directly adjacent to a channel region 61 of 3 $\mu$m length is a capacitor section without providing a source region of the transistor. This capacitor section is formed of an inversion layer 57, an insulation film 55' continuously extended from the gate insulator film 55, and a capacitor electrode 58 made of polycrystalline silicon. In this memory cell, since the capacitor section is directly adjacent to the channel section of the transistor as noted above, the gate electrode, i.e., the word line 51, extends above the capacitor electrode 58 in an overlapped relationship. In this preferred embodiment, since molybdenum is used for the gate electrode 51, there is no need to connect the gate electrode to an aluminum wiring and to use this wiring as a word line as is the case with the silicon gate, but a sufficiently high speed operation is enabled even if this gate electrode 51 is in itself extended in one direction for use as a word line. While an insulating film 59 as seen in FIGS. 15B and 15C could be either a thermal oxidation film or a CVD oxidation film, the portion 62 of 0.1 $\mu$m width of the insulating film between the gate electrode 51 and the capacitor electrode 58 is a thermal oxidation film.

Figure 16:
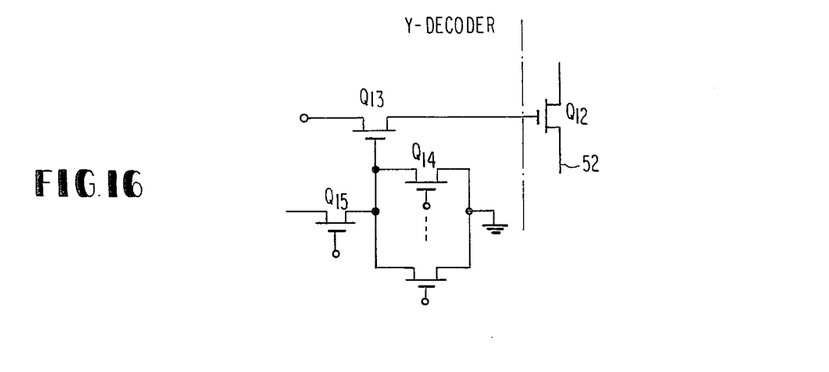
FIG. 16 is a circuit diagram showing an encircled portion 500 in FIG. 14.
Figure 17A:
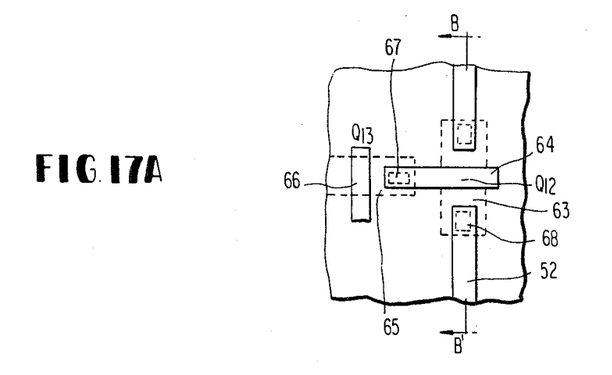
FIG. 17A is a plan view showing a part of the circuitry shown in FIG. 16.
Figure 17B:
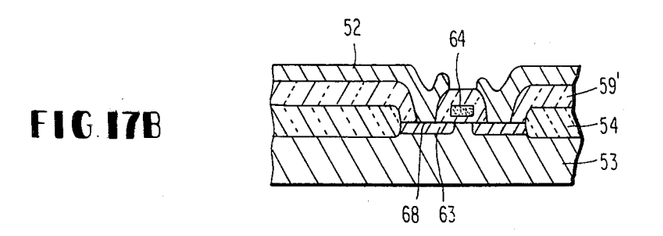
FIG. 17B is a cross-sectional view taken along line B-B' in FIG. 17A as viewed in the direction of the arrows.

A circuit diagram showing the encircled portion 500 in FIG. 14 is illustrated in FIG. 16, and a part of this circuitry is illustrated in plan and cross-section in FIGS. 17A and 17B, respectively. These figures illustrate a semiconductor structure for connecting the bit line 52 in FIG. 15 to a Y-decoder. As seen in FIGS. 17A and 17B, the bit line 52 made of aluminum is directly connected at a contact section 68 to drain region 63 of a Y-select switching transistor $Q_{12}$. A gate electrode 64 of the transistor $Q_{12}$ is formed of polycrystalline silicon because it is directly connected at a contact section 67 to a drain region 65 of a transistor $Q_{13}$ in the Y-decoder. Also, a gate electrode 66 of the transistor $Q_{13}$ is formed of polycrystalline silicon because it is directly connected to a source region and a drain region of a load transistor $Q_{15}$ and an input transistor $Q_{14}$, respectively.

Figure 18:
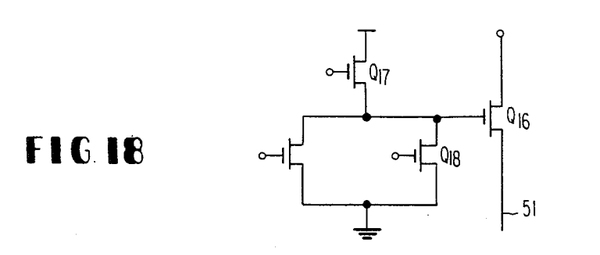
FIG. 18 is a circuit diagram showing an encircled portion 600 in FIG. 14.
Figure 19A:
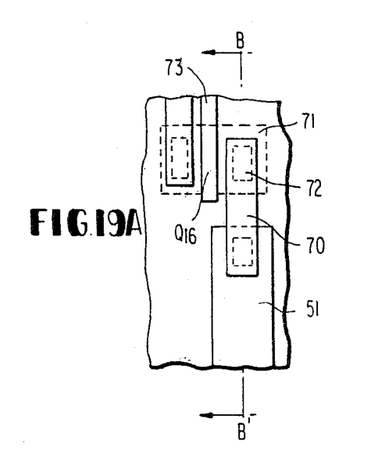
FIG. 19A is a plan view showing a part of the circuitry shown in FIG. 18.
Figure 19B:
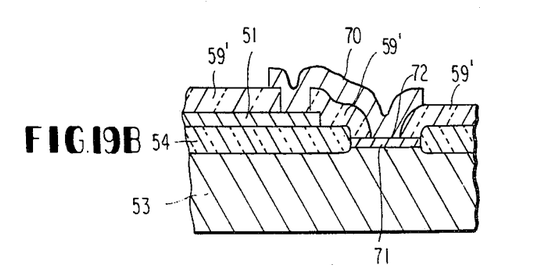
FIG. 19B is a cross-sectional view taken along line B-B' in FIG. 19A as viewed in the direction of the arrows.

On the other hand, the word lines 51 formed of molybdenum are connected at one end to an X-decoder and the semiconductor structure for realizing this connection will be described with reference to FIGS. 18, 19A and 9B which illustrate details of the encircled portion 600 in FIG. 14. The word line 51 is connected at a contact section 72 to a drain region 71 of a transistor $Q_{16}$, by the intermediary of an aluminum layer 70 through two holes provided in the insulating film 59'. Here it is to be noted that since the connection between the word line 51 of molybdenum and the aluminum layer 70 is effected at the input of the X-decoder and not within a memory cell, even if the effective length of the aluminum layer 70 is selected to have a necesssary size taking into consideration the reliability of the connection, it does not affect the degree of circuit integration. A gate electrode 73 of transistor $Q_{16}$ is formed of polycrystalline silicon because it is directly connected to a source region and a drain region of a load transistor $Q_{17}$ and an input transistor $Q_{18}$, respectively. In addition, in a peripheral circuit such as the X-decoder and Y-decoder, gate electrodes of transistors should preferably be formed in a silicon gate type even if they do not have a direct contact, because they do not extend long as the word lines in the memory matrix section. In the dummy cell, gate electrodes of transistors are formed of the same material as that in the dynamic memory cell. Also, in the sense amplifier, gate electrodes of transistors may be formed of the same material as that in the static memory cell.

We claim:
1. A semiconductor integrated circuit device comprising:
 a first insulated gate field effect transistor including source and drain regions of N conductivity type formed along a major surface of a semiconductor substrate of P conductivity type, a channel region positioned between said source and drain regions, a gate insulator film formed on said channel region, and a gate electrode made of a high-melting-point metal and formed on said gate insulator film; and a second insulated gate field effect transistor including a gate insulator film formed on said major surface of said substrate and a gate elecgtrode made of a semi-conductor material, formed on said gate insulator film of said second transistor and contacting directly with a surface of one of said source and drain regions of said first transistor.

2. A semiconductor integrated circuit device of claim 1, in which said high melting point metal is molybdenum and said semiconductor material is polycrystalline silicon.

3. A semiconductor integrated circuit device comprising a semiconductor substrate of one conductivity type having a major surface and first and second insulated gate field effect transistors each having source and drain regions, said first transistor having a gate electrode made of a high-melting-point metal, said gate electrode of said first transistor having no direct contact with any part of said major surface of said substrate, said second transistor having a gate electrode made of a semiconductor material of N conductivity type, said gate electrode of said second transistor being directly contacted with one of said source and drain regions of said first transistor.

4. A semiconductor integrated circuit device of claim 3, in which one of said source and drain regions of said first transistor is continuously formed from one of said source and drain regions of said second transistor.

5. A semiconductor integrated circuit device of claim 3, in which said high-melting-point metal is molybdenum and said semiconductor material is polycrystalline silicon.

6. A semiconductor integrated circuit device of claim 3, in which said first transistor is an enhancement type transistor and said second transistor is a depletion type transistor.

7. A semiconductor memory device comprising a plurality of pairs of bit lines extending in the column direction, a plurality of word lines made of a high-melting-point metal and extending in the row direction, and a plurality of static memory cells arranged in a matrix form and coupled respectively to each pair of bit lines and each word line, said static memory cell including first and second transfer gate transistors each having source and drain regions and each having one of its source and drain regions connected to a respective one of a pair of bit lines, two load transistors, and two driving transistors, the gate electrode of said first transfer gate transistor being made of said high-melting-point metal and being continuous with one of said word lines, the gate electrode of said second transfer gate transistor being made of said high melting point metal and being continuous from said one word line, and said two load transistors and said two driving transistors having gate electrodes made of silicon.

8. A semiconductor memory device of claim 7, further comprising an X-decoder, wherein said X-decoder includes a plurality of insulated gate field effect transistors, and all of said transistors in said X-decoder are silicon gate type transistors.

9. A semiconductor memory device of claim 8, in which each of said word lines is coupled to a silicon gate electrode of one of said transistors in said X-decoder via an aluminum connecting layer.

10. A semiconductor memory device of claim 8, in which each of said word lines is directly connected to a silicon electrode of one of said transistors in said X-decoder.

11. A semiconductor memory device of claim 8, further comprising a Y-decoder, wherein said Y-decoder includes in plurality of insulated gate field effect transistors, and all of said transistors in said Y-decoder are silicon gate type transistors.

12. A semiconductor memory device comprising a semi-conductor substrate, a plurality of bit lines extending in a column direction, a plurality of word lines made of a high-melting-point metal and extending in a row/-direction, a plurality of dynamic memory cells arranged in a matrix form and coupled respectively to each bit line and each word line, and a decoder having a first insulated gate field effect transistor, said memory cell including a transfer gate transistor, said transfer gate transistor having an impurity region for one of a source and drain region connected to one of said bit lines, a channel area abutting against said impurity region, a gate insulator film formed on said channel region and a gate electrode made of said high-melting-point metal and being formed continuously with one of said word lines, said first transistor of said decoder having source and drain regions and a gate electrode made of a semiconductor material, said one of said word lines being connected to one of said source and drain regions of said first transistor via an intermediate layer, and said gate electrode of said first transistor being directly connected to a predetermined portion of said semi-conductor substrate.

13. The semiconductor memory device of claim 12, in which said decoder includes a plurality of insulated gate field effect transistors each having source and drain regions, and all of said transistor in said decoder are silicon gate type transistors.

14. The semiconductor memory device of claim 12, in which said intermediate layer is made of aluminum.

15. The semiconductor memory device of claim 12, in which said predetermined portion of said semiconductor substrate is an area of one of source and drain regions of a second insulated gate field effect transistor of said decoder.

16. A semiconductor integrated circuit device comprising a semiconductor substrate having a major surface, a first gate wiring made of a high-melting-point metal, a second gate wiring made of a semiconductor material, a first insulated gate field effect transistor of N-channel type having source and drain regions and a gate electrode, and a second insulated gate field effect transistor of N-channel type having source and drain regions and a gate electrode, said gate electrode of said first transistor being made of said high melting point metal and being continuous with said first gate wiring, said gate electrode of said second transistor being made of said semiconductor material and being continuous with said second gate wiring, said first gate wiring having no direct contact with any part of said major surface of said substrate, and said second gate wiring being in direct contact with a part of said major surface of said substrate.

* * * * *

UNITED STATES PATENT AND TRADEMARK OFFICE
CERTIFICATE OF CORRECTION

PATENT NO. : 4,348,746
DATED : September 7, 1982
INVENTOR(S) : Hidekazu Okabayashi It is certified that error appears in the above-identified patent and that said Letters Patent is hereby corrected as shown below:

Column 1, line 46 - change "typw" to --type--;

line 67 - change "connections" to --connection--;

Column 2, line 3 - delete "becomes large" insert --is increased--;

line 51 - delete "aluminum" (second occurrence);

Column 3, line 34 - change "dopant" to --dopants--;

lines 53-54 - delete "holes, is a great" insert                 --holes is a great disadvantage--;

Column 7, line 31 - change "film" to --films--;

line 46 - delete " , " after "silicon gates" and                 insert -- , -- after "metal gates";

Column 8, line 34 - change "gas" to --glass--;

line 52 - after "off" insert --only--;

Column 9, line 22 - change "IN" to --In--;

Column 10, line 36 - change "9B" to --19B--;

UNITED STATES PATENT AND TRADEMARK OFFICE
CERTIFICATE OF CORRECTION

PATENT NO. : 4,348,746

DATED : September 7, 1982

INVENTOR(S) : Hidekazu Okabayashi

It is certified that error appears in the above-identified patent and that said Letters Patent is hereby corrected as shown below:

Column 10, line 55 - after "extend" insert --as--;

IN THE CLAIMS:

Column 12, line 5 - after "silicon" insert --gate--.

Signed and Sealed this

Twenty-second Day of February 1983

[SEAL]

Attest:

GERALD J. MOSSINGHOFF

Attesting Officer

Commissioner of Patents and Trademarks